United States Patent
Parker

(10) Patent No.: US 10,024,724 B2
(45) Date of Patent: Jul. 17, 2018

(54) TEMPERATURE MONITORING SYSTEMS AND METHODS FOR ELECTRICAL POWER DISTRIBUTION SYSTEMS

(71) Applicant: Tyco Electronics Corporation, Berwyn, PA (US)

(72) Inventor: Stephen M. Parker, Greensboro, NC (US)

(73) Assignee: TE Connectivity Corporation, Berwyn, PA (US)

( * ) Notice: Subject to any disclaimer, the term of this patent is extended or adjusted under 35 U.S.C. 154(b) by 402 days.

(21) Appl. No.: 14/929,844

(22) Filed: Nov. 2, 2015

(65) Prior Publication Data

US 2017/0122813 A1    May 4, 2017

(51) Int. Cl.
| | |
|---|---|
| G01K 13/00 | (2006.01) |
| G01K 1/08 | (2006.01) |
| G01K 1/24 | (2006.01) |
| G08B 5/02 | (2006.01) |
| G01K 1/02 | (2006.01) |
| G01K 1/14 | (2006.01) |
| G01R 31/40 | (2014.01) |

(52) U.S. Cl.
CPC ............ *G01K 1/024* (2013.01); *G01K 1/14* (2013.01); *G08B 5/02* (2013.01); *G01R 31/40* (2013.01)

(58) Field of Classification Search
CPC ....... G05F 1/66; H02J 13/0082; H02J 7/0021; H01R 13/64; H01R 13/7137; H01R 25/00; H01R 27/00; H01R 43/26; G01K 1/024; G01K 1/14; G01K 13/00; G01K 1/08
See application file for complete search history.

(56) References Cited

U.S. PATENT DOCUMENTS

| | | | |
|---|---|---|---|
| 4,757,263 A | 7/1988 | Cummings, III et al. | |
| 4,975,800 A | 12/1990 | Oshita et al. | |
| 5,439,742 A * | 8/1995 | Baker | C08K 5/098 252/400.1 |
| 6,949,934 B1 | 9/2005 | Vu et al. | |
| 7,306,489 B2 * | 12/2007 | Werthman | G01K 1/14 374/E1.018 |
| 8,303,337 B2 * | 11/2012 | Ballard | B60R 16/0207 174/113 R |
| 8,305,737 B2 * | 11/2012 | Ewing | G06F 1/266 174/59 |
| 9,450,347 B2 * | 9/2016 | Kondou | H01R 13/6683 |
| 9,564,719 B1 * | 2/2017 | Oldham | H01R 13/7137 |
| 2002/0043978 A1 * | 4/2002 | McDonald | G01R 31/043 324/508 |

(Continued)

FOREIGN PATENT DOCUMENTS

| | | | |
|---|---|---|---|
| CN | 201522342 U | * | 7/2010 |
| EP | 0 942 292 A2 | | 9/1999 |

(Continued)

*Primary Examiner* — Gail Kaplan Verbitsky

(74) *Attorney, Agent, or Firm* — Myers Bigel, P.A.

(57) ABSTRACT

An electrical power distribution system includes an electrical connector, an electrical conductor and a temperature monitoring system. The electrical conductor is secured to the electrical connector to form an electrical connection. The temperature monitoring system includes a temperature monitoring device. The temperature monitoring device includes a temperature sensor coupled to the connector to detect a temperature of the connection.

22 Claims, 7 Drawing Sheets

(56) References Cited

U.S. PATENT DOCUMENTS

| | | | |
|---|---|---|---|
| 2005/0212646 A1* | 9/2005 | Watchorn | H01H 37/5409 337/16 |
| 2008/0120048 A1* | 5/2008 | Zhou | H02H 3/42 702/60 |
| 2008/0278339 A1* | 11/2008 | Chen | G01K 3/00 340/584 |
| 2009/0251832 A1* | 10/2009 | Brugner | H01R 13/6683 361/42 |
| 2012/0183017 A1* | 7/2012 | Schnaitter | G01K 7/01 374/178 |
| 2012/0206840 A1* | 8/2012 | Goelz | H01R 13/6683 361/1 |
| 2012/0327745 A1 | 12/2012 | Yardibi et al. | |
| 2013/0189868 A1* | 7/2013 | Fitt | H01R 13/518 439/272 |
| 2014/0073189 A1* | 3/2014 | Kondou | H01R 13/7137 439/620.21 |
| 2014/0236372 A1* | 8/2014 | Ewing | H04L 12/10 700/295 |
| 2014/0269812 A1* | 9/2014 | Deutscher | G01K 15/005 374/1 |
| 2017/0005443 A1* | 1/2017 | O'Rourke | H01R 31/02 |
| 2017/0077693 A1* | 3/2017 | Lermann | G05B 15/02 |
| 2017/0358890 A1* | 12/2017 | Chen | H01R 13/6608 |

FOREIGN PATENT DOCUMENTS

| | | |
|---|---|---|
| JP | H0850160 A | 2/1996 |
| WO | WO 01/48498 A1 | 7/2001 |
| WO | WO 2011/032585 A1 | 3/2011 |

* cited by examiner

TEMPERATURE MONITORING SYSTEMS AND METHODS FOR ELECTRICAL POWER DISTRIBUTION SYSTEMS

FIELD OF THE INVENTION

The present invention relates to electrical connections in electrical power distribution systems and, more particularly, to methods and apparatus for monitoring electrical connections in electrical power distribution systems.

BACKGROUND OF THE INVENTION

Infra-red scanning equipment is commonly used to locate "hot spots" (thermally hot regions) in substation equipment in electrical power distributions systems (e.g., operated by electrical power utilities). These hot spots are typically found at the connection points of the equipment, where an electrical conductor or bus bar connects to a bushing of a transformer, regulator, breaker or other electrically conductive equipment. If the connection is poor or degraded, or if an internal mechanism of the equipment is failing, the connection will appear hotter in an IR scan than the adjacent connections on that equipment. If caught in time, the connection or equipment can be replaced or repaired before a complete failure occurs.

The bushings and the support structures on which they are mounted are often located outdoors. One problem with such installations, particularly with power distribution lines that transmit electrical power at high voltages, is that animals (e.g., birds, squirrels, raccoons, and feral cats) may land or climb onto the lines. Such contact of power lines by animals, particularly adjacent the support structure, may cause a short or electrical flash-over allowing current flow through the animal, which may cause a power outage or other problem with the substation equipment or power distribution system.

For example, it is known that animals may from time to time climb onto substation equipment. An animal may span a connection of the substation equipment and another component of the substation and create a short-circuit or flash-over. Such an electrical flashover can harm the animal and can also cause a power outage or other problem with the power distribution system or substation equipment.

SUMMARY OF THE INVENTION

According to embodiments of the invention, an electrical power distribution system includes an electrical connector, an electrical conductor and a temperature monitoring system. The electrical conductor is secured to the electrical connector to form an electrical connection. The temperature monitoring system includes a temperature monitoring device. The temperature monitoring device includes a temperature sensor coupled to the connector to detect a temperature of the connection.

According to method embodiments of the invention, a method for monitoring an electrical power distribution system includes: electrically securing an electrical conductor to an electrical connector to form a connection; providing a temperature monitoring system including a temperature monitoring device, the temperature monitoring device including a temperature sensor; and coupling the temperature sensor to the connector to detect a temperature of the connection.

According to embodiments of the invention, a temperature monitoring module for monitoring a temperature of an electrical connection between an electrical connector and an electrical conductor includes an integral temperature sensor to detect a temperature of the connection, and an integral reporting device operative to generate an alert in response to detection of a temperature even at the connection by the temperature monitoring module. The temperature monitoring module is configured to be secured to the connector.

Further features, advantages and details of the present invention will be appreciated by those of ordinary skill in the art from a reading of the figures and the detailed description of the embodiments that follow, such description being merely illustrative of the present invention.

DETAILED DESCRIPTION OF EMBODIMENTS OF THE INVENTION

Figure 1:
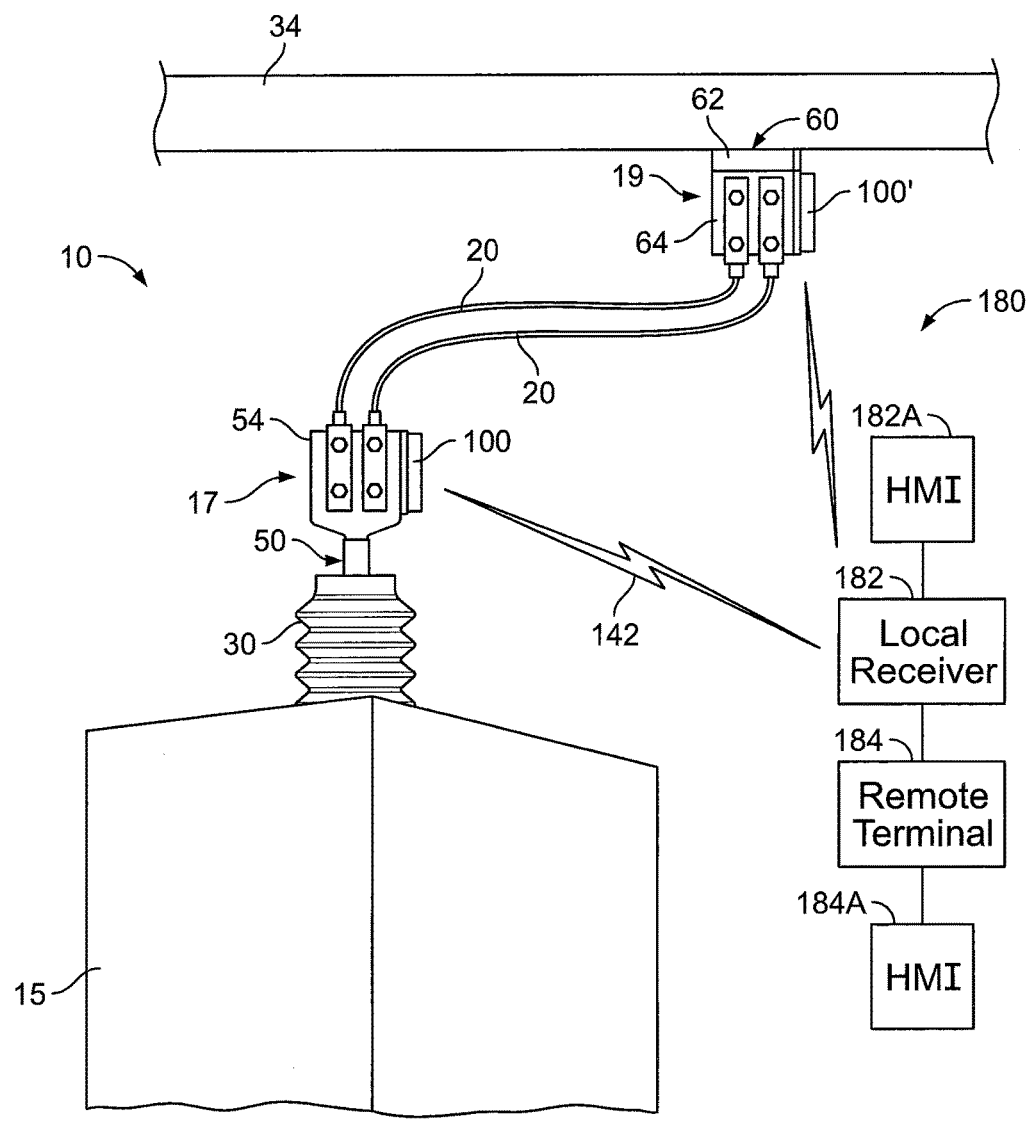
FIG. 1 is a perspective view of an electrical power distribution system including a temperature monitoring system according to embodiments of the invention.
Figure 2:
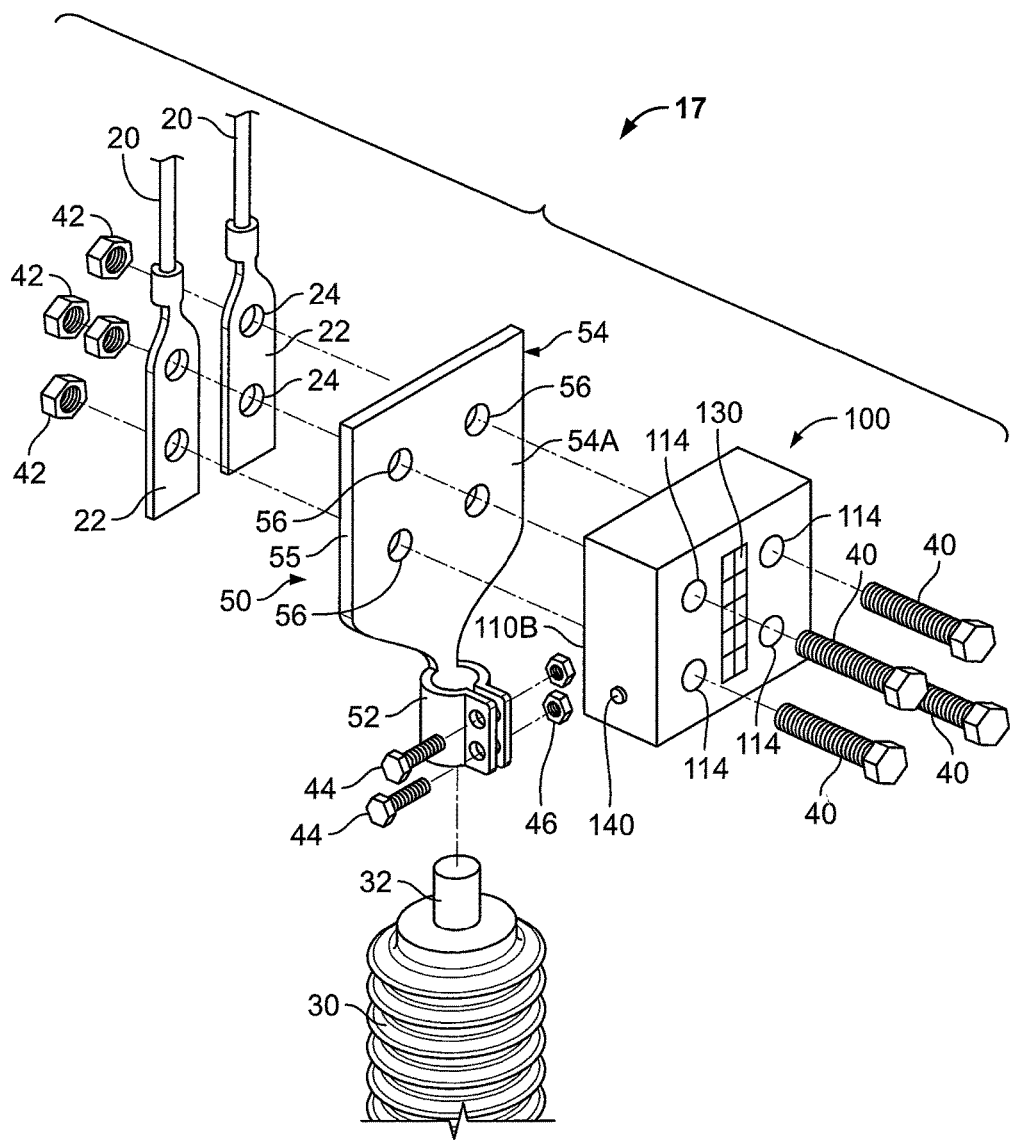
FIG. 2 is a fragmentary, exploded, perspective view of a temperature monitoring module and a pair of cables installed on a connector and bushing of the electrical power distribution system of FIG. 1.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 7:
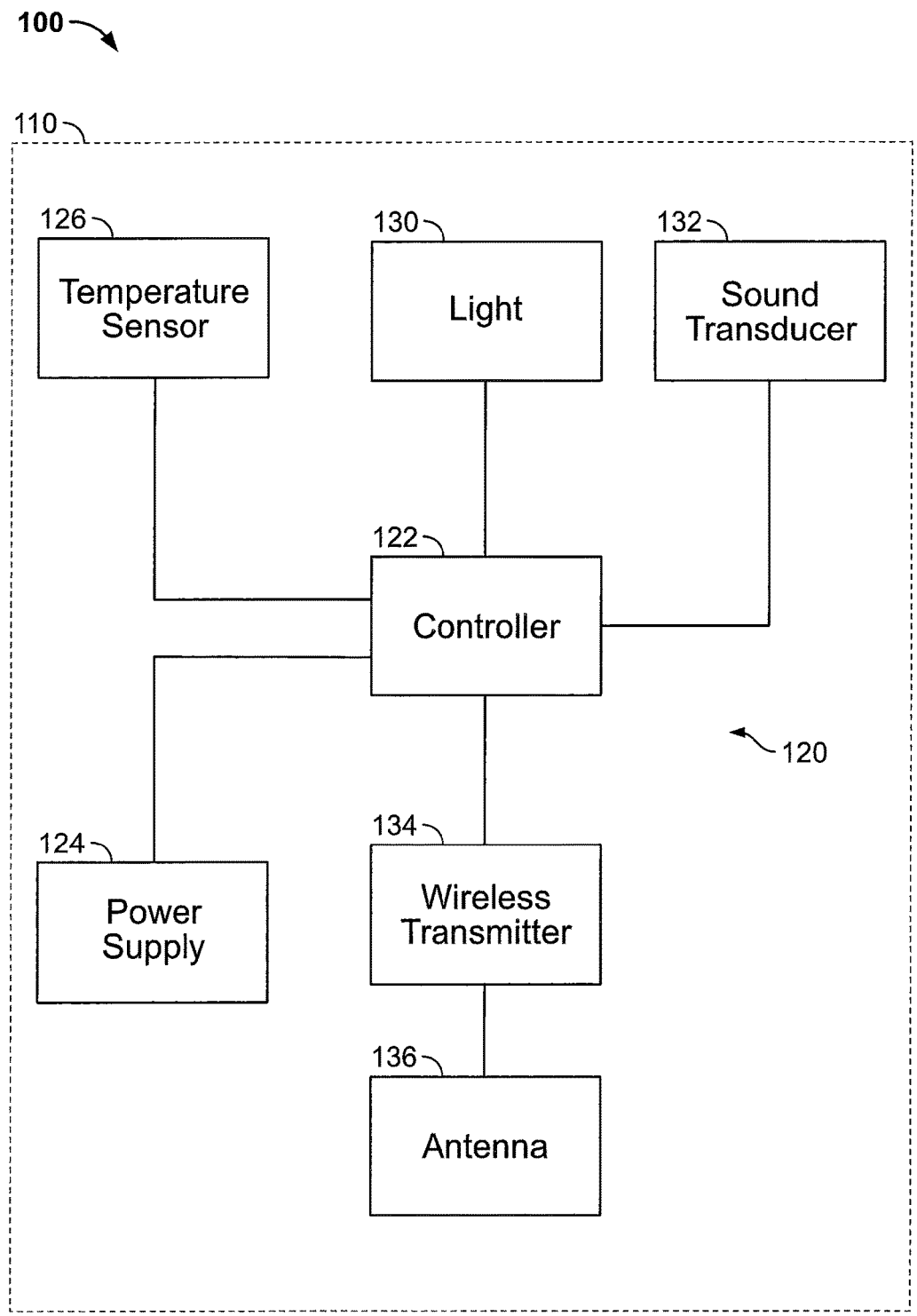
FIG. 7 is a schematic diagram of the temperature monitoring module of FIG. 2.

With reference to FIGS. 1-5, an electrical power distribution system 10 is shown therein including two temperature monitoring devices, units or modules 100, 100' according to embodiments of the invention. The modules 100, 100' may be operatively incorporated in a temperature monitoring system 180 according to embodiments of the invention. The system 10 is merely exemplary and includes electrical equipment 15, an electrical bushing or insulator 30, an electrically conductive bus bar 34, and electrical conductors or cables 20 electrically connected to the equipment 15 and the bus bar 34 at connections 17 and 19. The equipment 15, cables 20, insulator 30, bus bar 34, and connections 17, 19 collectively form an electrical power distribution installation, such as a substation, on which the temperature sensing modules 100, 100' are installed or mounted. The system 10 may be further provided with an environmental or wildlife protection cover 70 (FIG. 7).

The electrical insulator or bushing 30 is mounted on the equipment 15. An electrical conductor 32 is electrically connected to the equipment 15 and extends through and projects from the bushing 30. The illustrated bushing 30 includes annular sheds; however, bushings of any suitable configuration may be employed. The bushing 30 may be formed of any suitable material, such as a polymer or ceramic. In some embodiments, the equipment 15 is an electrical power transformer, a voltage regulator, a circuit breaker, a capacitor or other electrically conductive equipment.

An electrical connector 50 is mounted on the bushing 30. The connector 50 is a terminal connector and includes a base portion 52 mechanically and electrically coupled to the conductor 32 and an integral, upstanding connection pad 54, as discussed in more detail below. In the illustrated embodiment, the base 52 is tubular and receives the conductor 32 and is clamped thereon by bolts 44 and nuts 46. The connector 50, including the connection pad 54, may be formed of any suitable material, such as metal (e.g., steel, aluminum or copper).

A connector 60 is mounted on the bus bar 34. The connector 60 is a terminal connector and includes a base 62 and a connection pad 64. The base 62 is mechanically and electrically coupled to the bus bar 34 such as by fasteners or welding. The base 62 may be, for example, a flat plate or bent wall integral with the connection pad 64. The connector 60, including the connection pad 64, may be formed of any suitable material, such as metal (e.g., steel, aluminum or copper).

In the illustrated embodiment, each cable 20 is terminated at each end with a cable connector or lug 22. Each lug 22 includes a pair of spaced apart fastener through holes 24. In other embodiments, two or more cables may be terminated to a common connector such as a connector plate having four spaced apart holes. As discussed below, the lugs 22 are secured to respective ones of the connection pads 54, 64 by fasteners such as bolts 40 and nuts 42.

The connection pad 54 and the connection pad 64 may be constructed in substantially the same manner. Therefore, only the connection pad 54 will be described below in detail and it will be appreciated that this description likewise applies to the connection pad 64.

Figure 5:
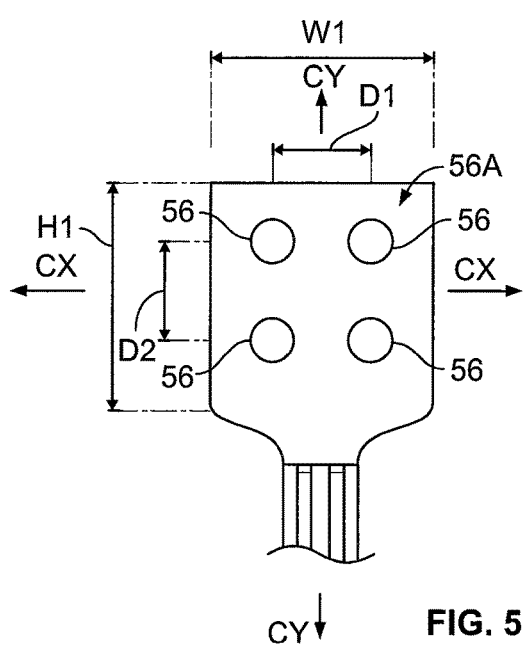
FIG. 5 is a fragmentary, front view of the connector of FIG. 2.
Figure 6:
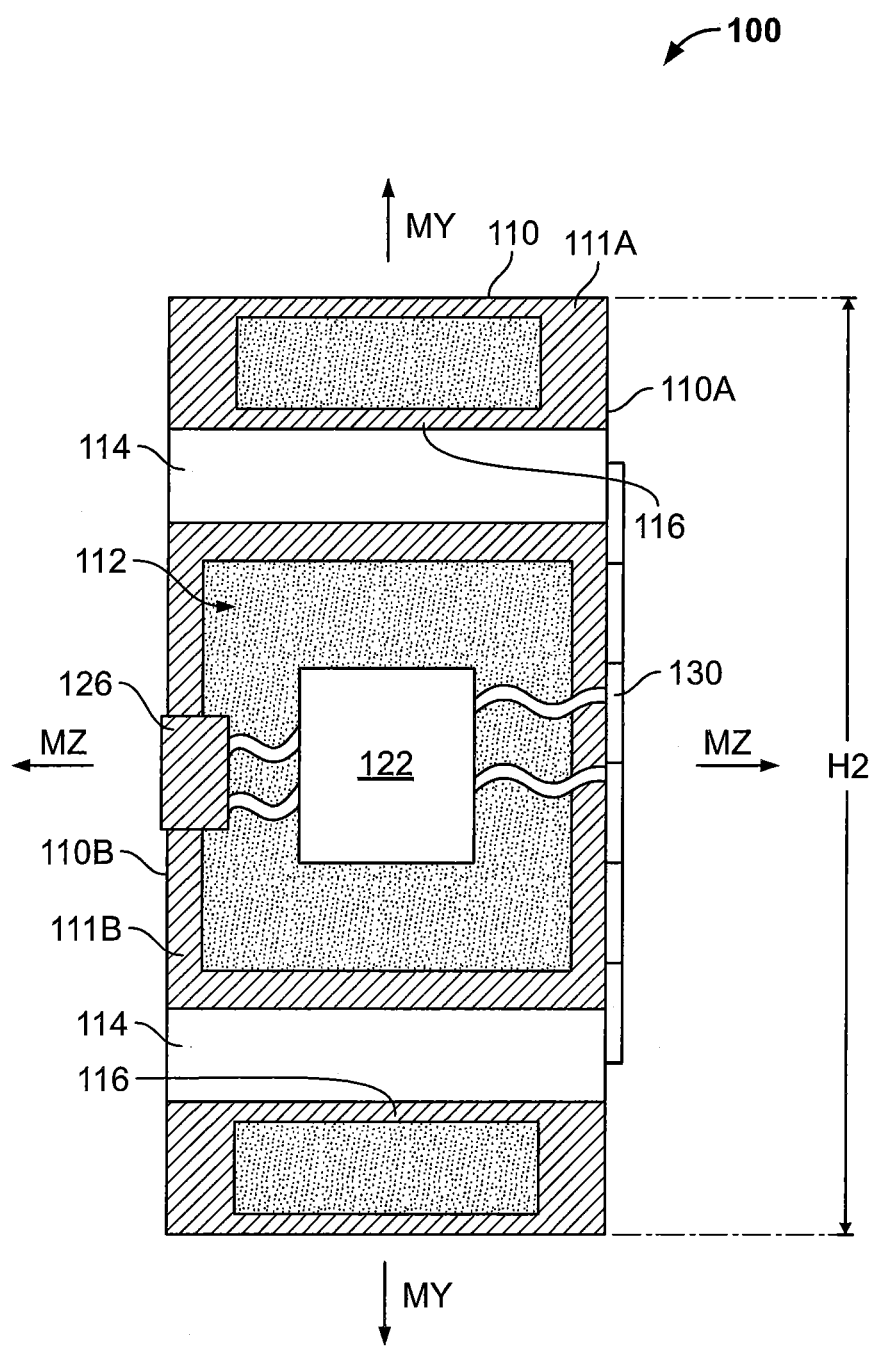
FIG. 6 is a cross-sectional view of the temperature monitoring module of FIG. 2 taken along the line 6-6 of FIG. 4.

The connection pad 54 includes a body 55 having opposed faces 54A, 54B. The body 55 may, as illustrated, have the form of a flat plate. For the purpose of explanation, the body 55 has a first axis CX-CX, a second axis CY-CY perpendicular to the axis CX-CX, and a third axis CZ-CZ perpendicular to each of the axes CX-CX, CY-CY (FIG. 5). The axes CX-CX and CY-CY collectively define a connection pad plane. In some embodiments, the faces 54A, 54B are each substantially flat or planar and lie parallel to the connection pad plane. At least one, and in some embodiments both, of the contact faces are electrical contact surfaces electrically connected to the base 52.

Four spaced apart through holes 56 are defined in the connection pad 54 and extend fully therethrough from face 54A to face 54B (e.g., substantially parallel to the axis CZ-CZ). In some embodiments and as illustrated, the center points of holes 56 define a square (i.e., the hole center points form the corners of the square). According to some embodiments, the spacing distance D1 between the centers of adjacent holes 56 along the CX-CX axis and the spacing distance D2 between the centers of adjacent holes along the CY-CY axis are in the range of from about 2 to 4 inches and, in some embodiments, are in the range of from about 2 to 4 inches (FIG. 5).

According to some embodiments, the connection pad 54 has a width W1 (parallel to the axis CX-CX) in the range of from about 1.5 to 5 inches (FIG. 5). According to some embodiments, the connection pad 54 has a height H1 (parallel to the axis CY-CY) in the range of from about 1.5 to 5 inches (FIG. 5). According to some embodiments, the contact faces 54A, 54B each have a surface area in the range of from about 7.5 to 25 inches and, in some embodiments, are in the range of from about 7.5 to 25 inches.

Figure 3:
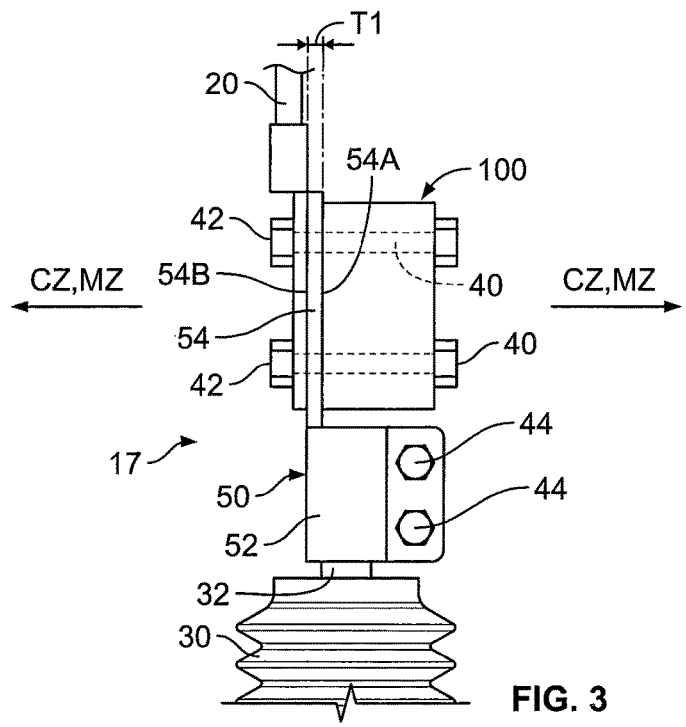
FIG. 3 is a side view of the temperature monitoring module and cables mounted on the connector and bushing of FIG. 2.

According to some embodiments, the connection pad 54 has a thickness T1 in the range of from about 0.1875 to 0.5 inches (FIG. 3).

According to some embodiments, the connection pad 54 is compliant with an official industry standard for electrical terminal connectors. In some embodiments, the connection pad 54 is compliant with an official industry standard for electrical terminal connectors for electrical power transmission substations. According to some embodiments, the connection pad 54 is compliant with National Electrical Manufacturers Association (NEMA) Standard CC 1-2009 titled "Electrical Power Connectors for Substations".

The temperature monitoring modules 100 and 100' may be substantially identical or constructed in substantially the same manner. Therefore, only the module 100 will be described herein below in detail and it will be appreciated that the description likewise applies to the unit 100'.

With reference to FIGS. 2-4, 6 and 7, the temperature monitoring module 100 is modular and includes a housing 110 defining a cavity 112. The housing 110 includes a front wall 111A and a rear wall 111B having opposed front and rear faces 110A and 110B, respectively. For the purpose of explanation, the housing 110 has a first axis MX-MX, a second axis MY-MY perpendicular to the axis MX-MX, and a third axis MZ-MZ perpendicular to each of the axes MX-MX, MY-MY. The axes MX-MX and MY-MY define a monitoring module plane. In some embodiments, at least the rear face 110B is substantially flat or planar and lies parallel to the monitoring module plane.

Four spaced apart through holes 114 are defined in housing 110 and extend fully therethrough from face 110A to face 110B (e.g., substantially parallel to the axis MZ-MZ). In some embodiments and as illustrated, the hole pattern of the holes 114 matches the hole pattern of the holes 56. That is, the spacing and relative arrangement of the set 114A of the holes 114 is the same as the spacing and relative arrangement of the set 56A of the holes 56. Thus, the lateral spacing D3 between the centers of adjacent holes 114 will be substantially the same as the lateral spacing D1, and the vertical spacing D4 between the centers of adjacent holes 114 will be substantially the same as the spacing D2 (FIG. 4).

In some embodiments, the housing 110 includes tubular walls 116 extending from the front wall 111A to the rear wall 111B and defining the holes 114.

Figure 4:
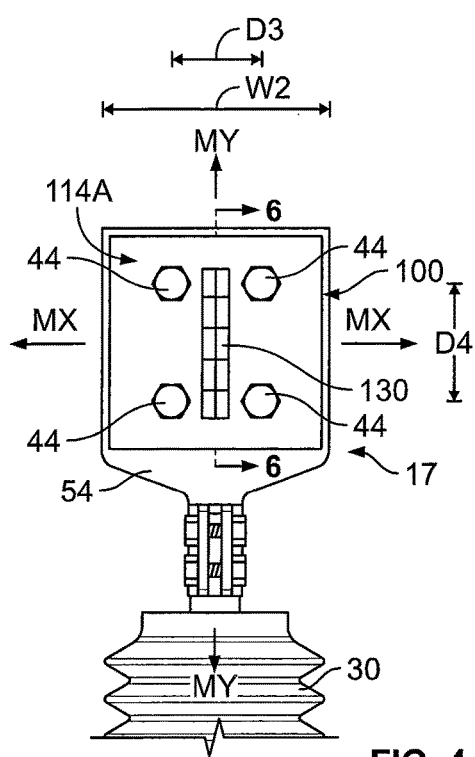
FIG. 4 is a front view of the assembly of FIG. 3.

According to some embodiments, the rear wall 111B has a width W2 (parallel to the axis MX-MX) in the range of from about 1.5 to 5 inches (FIG. 4). According to some embodiments, the rear wall 111B has a height H2 (parallel to the axis MY-MY) in the range of from about 1.5 to 5 inches (FIG. 4). According to some embodiments, the rear wall 111B has a surface area in the range of from about 50 to 100 percent of the surface area of the connection pad face 54A.

The housing 110 may be formed of any suitable material. According to some embodiments, the housing 110 is formed of aluminum or high temperature polymer. According to some embodiments, the material and geometry of the housing 110 are selected such that the module can withstand simultaneous compressive loads at the four holes 114 along axes parallel to the axis MZ-MZ of at least about 5,000 pounds.

The module 100 further includes an electrical circuit 120 (FIG. 7). Portions of the circuit are mounted in the cavity 112. In some embodiments, potting is provided in the cavity 112 about the electrical circuit 120 to environmentally protect the circuit 120.

The illustrated electrical circuit 120 includes a controller 122, a power supply 124, a temperature sensor 126, a light 130 (a visible indicator), a sound transducer 132 (an audible indicator), a wireless transmitter 134, and an antenna 136. It will be appreciated from the discussion herein that certain of the foregoing components may be omitted, depending on the intended functionality of the module 100.

The controller 120 may be any suitable electronic control device such as a microprocessor.

The power supply 124 can be any suitable device or source for providing electrical power to the controller 122 and other components of the circuit 120. In some embodiments, the power supply 124 includes an inductive coupling circuit or power supply device that provides a driving current to power the electrical circuit 120. In some embodiments, the power supply 124 may include a power storage battery also mounted on the housing 110 or otherwise on the system 10, and/or an external wired power supply.

The temperature sensor 122 can be any suitable temperature sensor device. Suitable temperature sensors may include passive devices such as a thermocouple or resistor temperature detector (RTD), and active temperature sensors having suitable power consumption and interface. The temperature sensor 126 is configured to detect an environmental temperature and provide an electrical signal to the controller 122 corresponding or proportionate to the detected temperature. In some embodiments, the temperature sensor 126 includes a detection portion external of or exposed through the housing 110. In some embodiment, the temperature sensor 126 is fully contained in the housing 110 and configured to detect heat conducted through the housing 110.

The light 130 may be any suitable light device or devices. In some embodiments, the light 130 includes one or more light emitting diodes (LEDs) and, in some embodiments, a plurality of LEDs (e.g., an array of LEDs). In some embodiments, the light 130 is mounted externally of the housing 110. In some embodiments, the light 130 is mounted inside the housing 110 and is externally visible through a window in the housing 110.

The sound transducer 132 may be any suitable sound transducer, such as a piezoelectric sound transducer.

With reference to FIG. 1, the temperature monitoring system 180 includes the unit 100 and a local receiver 182. The local receiver 182 may include a human-machine interface (HMI) 182A and may be in further communication with a remote terminal 184 (which may also be provided with an HMI 184A). According to some embodiments, the local receiver 182 is spaced apart from the modules 100, 109' a distance in the range of from about 25 to 200 feet, and the remote terminal 184 is located at least 100 feet from the modules 100, 100'.

The cover 70 (FIG. 7) may be any suitable cover for protecting the connection 17 from wildlife, weather, debris or other environmental elements. The cover 70 may include a body 72 defining a cavity 72A to contain the connection pad 52 and the temperature monitoring module 100. The cover 70 includes a window 74 that provides a line of sight into the cavity 72 from outside the cover 70. For example, the window 74 may be provided by a plurality of openings 74A that permit visibility into the cavity while blocking intrusion of small animals. A conductor port 76 may be provided in the cover 70 to permit exit of the cables 20. The cover 70 may be formed of any suitable material, such as a polymer. The cover 70 may be configured to overlap and capture a distal portion of the bushing 30. Suitable covers include the BCAC-IC cover available from TE Connectivity and as disclosed in U.S. Pat. No. 8,426,729 to Hiller et al.

Installation and operation of the temperature monitoring module 100 and system 180 in accordance with embodiments of the invention will now be described with reference to the drawings.

As shown in FIGS. 1-4, the cable lugs 22 and the temperature monitoring unit 100 are each secured to the connection pad 54 by the bolts 40 and nuts 42. More particularly, the lugs 22 are placed on the connection pad face 54B in electrical contact therewith and the rear wall 111B is placed on the opposing connection pad face 54A such that the lug holes 24 are aligned with the pad holes 56 and the module through holes 114 are likewise aligned with the pad holes 56. The bolts 40 are each inserted through a respective aligned set of the holes 24, 56 and 114 (extending along a bolt axis CH-CH substantially parallel to the axes CZ-CZ and MZ-MZ) and secured by the nuts 42. Torque is applied to the bolts 40 or nuts 42 so that the lugs 22 and housing 110 (and particularly the rear wall 111B) are clamped or loaded against the faces 54A, 54B. In this way good electrical contact may provided between the lugs 22 and the face 54B, and good thermal contact may be provided between the face 54A and rear face 110B of the module 100.

As described above, the circuit 120 may be powered by an inductive power supply device 124. The inductive power supply device 124 parasitically draws power from the electric field generated by the current flowing through the connector 50 and provides this power to the electrical circuit 120 (including the light 130).

Thereafter, during operation of the system 180, the substation 10 and equipment 15, the temperature monitoring module 100 monitors the temperature of the connection 17 via the temperature sensor 126, which generates a temperature signal to the controller 122 representing temperature data corresponding to the temperature of the connection 17. In some embodiments, the temperature sensor 126 detects the temperature of the connection pad 54. In some embodiments, the module 100 continuously monitors the temperature of the connection 17 for an extended duration (e.g., at least 24 hours). In other embodiments, the module 100 periodically detects the temperature of the connection 17.

Using the acquired temperature data, the temperature monitoring system 180 determines whether a temperature event has occurred and, if so, triggers or executes an alert or alarm in response to the determination.

In some embodiments, a temperature event occurs (and is recognized or registered by the system 18Q (e.g., the controller 122)) if the temperature sensed by the sensor 126 exceeds a prescribed threshold temperature. In some embodiments, the prescribed threshold temperature is in the range of from about 150 to 300° C.

In some embodiments, a temperature event occurs (and is recognized or registered by the system 180 (e.g., the controller 122)) if the temperature sensed by the sensor 126 increases over time by more than a prescribed threshold temperature increase amount.

In some embodiments, a temperature event occurs (and is recognized or registered by the system 180 (e.g., the controller 122)) if the temperature sensed by the sensor 126 exceeds a reference temperature by at least a prescribed amount. The reference temperature may be variable. The reference temperature may be a temperature detected by another temperature sensor in the system 180. The other temperature sensor may be configured and positioned to detect ambient temperature proximate or in the vicinity of the equipment or a temperature of another connection pad proximate or in the vicinity of the equipment.

In some embodiments, the system 180 detects a temperature at the connection of interest (e.g., the connection 17) using the associated module (e.g., the module 100) and also measures the temperature of one or more other connections (reference connections) on the same equipment or similar equipment to acquire a reference temperature. In some embodiments, the reference connection or connections are connections between similar components at similar power loads. The threshold temperature for registering a temperature event is based on or determined as a function of the reference temperature(s) from the reference connection(s). In some embodiments, a temperature event is registered by the system 180 when the temperature difference between the temperature measured by the module 100 at the connection of interest and a reference connection (or, e.g., an average of reference connections) exceeds a prescribed temperature difference. In some embodiments, this prescribed temperature difference is in the range of from about 1 to 3° C. and, in some embodiments, is in the range of from about 5 to 20° C.

In some embodiments, the reference temperature is an ambient temperature measured by the system 180 using a temperature sensor local to the connection of interest, and a temperature event is registered by the system 180 when the difference between the temperature measured by the module 100 at the connection of interest and the measured ambient temperature exceeds a prescribed temperature difference. In some embodiments, this prescribed temperature difference is in the range of from about 10 to 20° C. and, in some embodiments, is in the range of from about 30 to 50° C.

According to some embodiments, the alert executed by the temperature monitoring system 180 (responsive to determination that a temperature event has occurred) is activation (i.e., illumination) of the integral light 130 onboard the unit 100. In some embodiments, the light 130 is illuminated and maintained illuminated until reset or turned off by an operator (e.g., a technician). The illumination of the light 130 may be constant or periodic (e.g., blinking).

According to some embodiments, the alert executed by the temperature monitoring system 180 (responsive to determination that a temperature event has occurred) is activation of the integral sound transducer 132 onboard the module 100 to emit an audible signal (e.g., a buzz, beep, message or horn sound). In some embodiments, the sound transducer 132 is actuated and the audible signal is maintained until reset or turned off by an operator (e.g., a technician). The audible signal may be constant or periodic (e.g., beeping). In some embodiments, the light alert and the sound alert are both activated in response to determination that a temperature event has occurred.

The visual and/or audible alerts (e.g., blinking light 130) can attract an attendant's attention, signaling the need for closer inspection.

In some embodiments, the alert is maintained activated until it is reset or turned off by an operator even if the temperature event terminates (e.g., the temperature detected by the sensor 122 drops back below the temperature threshold). The module 100 may be provided with a reset button 140 operable to reset the alarm.

The controller 122 may transmit a reporting signal 142 to the local receiver 182 corresponding to the temperature detected by the sensor 126 and/or the state of the connection (i.e., whether a temperature event has occurred). In some embodiments, the reporting signal 142 is a wireless (e.g., radiofrequency) signal generated by the transceiver 134. The local receiver 182 may also transmit informational and/or control signals 142 to the module 100. The data from the temperature sensor 126 may be processed by the controller 122 and/or the local receiver 182. The local receiver 182 may in turn transmit the temperature data, the state of the connection 17, and/or other data to the remote terminal 184. The remote terminal 184 may be a control office of the utility many miles from the site of the connector 50, for example. The local receiver 182 may be located within 25 feet of the connector 50.

Figure 8:
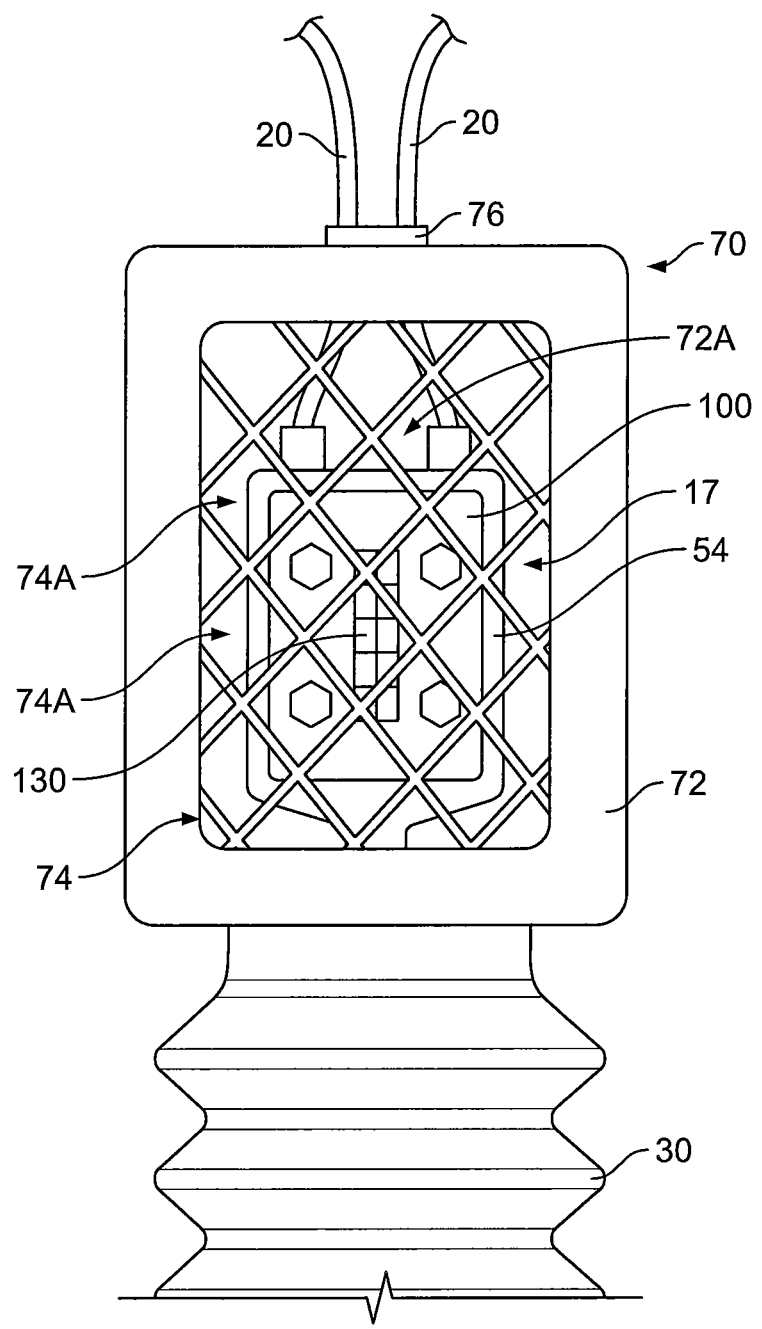
FIG. 8 is a front view of the assembly of FIG. 2 with a cover mounted thereon.

With reference to FIG. 8, in some embodiments, the cover 70 is mounted over the connection 17 so that the module 100 is contained in the cavity 72A. The light 130 can be seen through the window 74 when illuminated. Similarly, sound emitted from the sound transducer 132 can pass through the openings 74A.

With reference to FIG. 1, a temperature monitoring module 100' can likewise be mounted on the connection pad 62 of the connector 60 secured to the bus bar 34. The module 100 can detect the temperature of the connection 19 in the same manner as described above for the connection 17 and, responsive to determination that a temperature event has occurred at the connection 19, issue a visible alert, audible alert, and/or reporting signal as discussed above.

Figure 9:
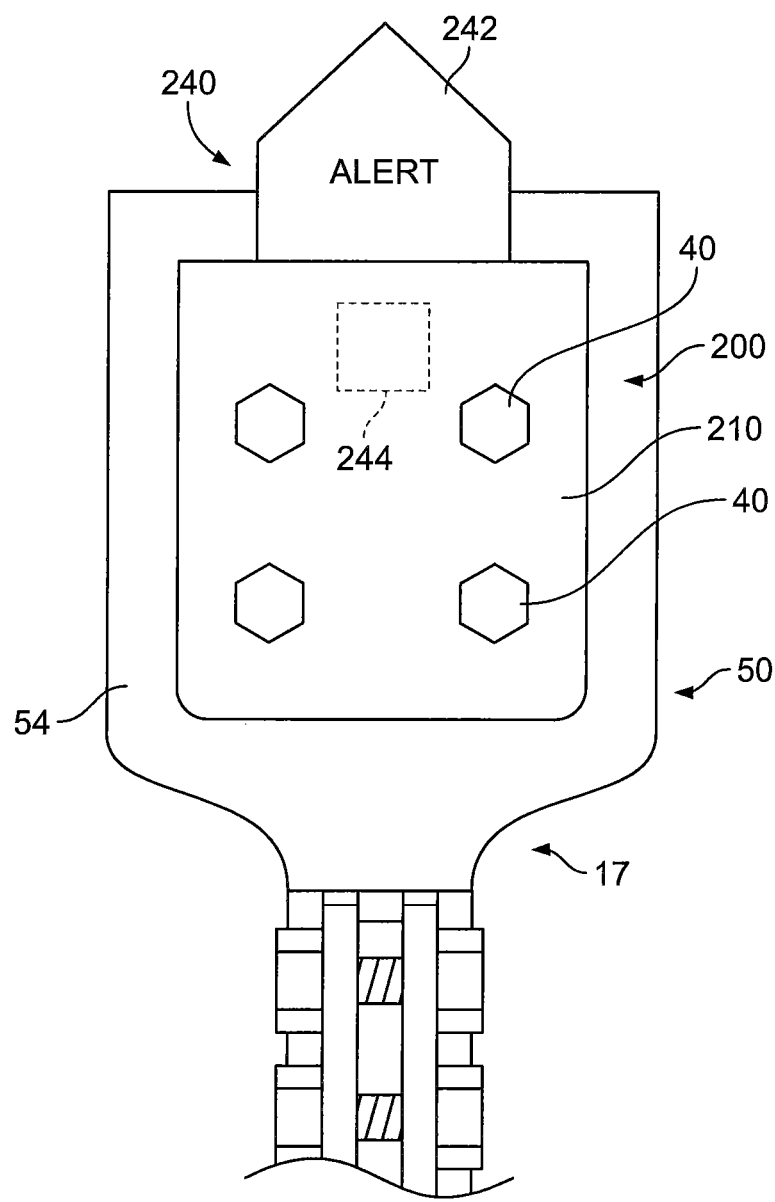
FIG. 9 is a fragmentary, front view of a temperature monitoring module according to further embodiments of the invention mounted on the connector of FIG. 2.

With reference to FIG. 9, a temperature monitoring device, unit or module 200 according to further embodiments of the invention is shown therein. The module 200 corresponds to the module 100 except that the light 130 is replaced with a mechanical indicator mechanism 240. The module 200 is secured to the connection pad 54 and the cable lugs 22 in the same manner as shown and described for the module 100.

In the illustrated embodiment, the mechanism 240 includes a pop up flag 242 and an actuator 244 operative to move (e.g., eject, release, raise or drop) the flag 242 from a stored position (e.g., hidden in the housing 210) to an alert position (as shown in FIG. 8). The extended flag 242 provides a visual signal to an attendant or surveyor. In this way, an operator can determine that a temperature event has occurred by observing the deployed flag 242. The pop up component 242 may be brightly or contrastingly colored to catch the attendant's attention and can take any other suitable form, such as a brightly colored rod.

The actuator 244 may be a spring loaded mechanism. In some embodiments, a mechanical triggering mechanism is provided in place of the electrical circuit 120. When the temperature of the connection pad 54 exceeds the threshold temperature, a mechanical trigger of the actuator 244 is actuated to displace the pop up flag 242 (e.g., by releasing the spring loaded mechanism).

Temperature monitoring modules and systems of the present invention (e.g., modules 100, 200 and system 180) can be used to identify, signal, and locate hot spots for early warning of defects and preventative maintenance. In this way, they can eliminate or reduce the need for costly infrared scanning. Repairs could be made as and when needed rather than as part of a routine maintenance plan.

As discussed above, the temperature monitoring modules 100, 200 can be configured to cooperatively mate with connection points in a power distribution system or substation having standardized dimensions and bolt patterns. The temperature monitoring modules 100, 200 can each be dimensioned, sized and shaped to mate well with a connection pad conforming or compliant with a NEMA guideline for dimensions and bolt patterns of a substation connection pad as discussed above. In particular, the pattern of the bolt holes 114 can be arranged to match the bolt pattern of a NEMA compliant connection pad. This may be particularly advantageous because the shape and size of equipment bushings can vary greatly, making it difficult to configure a temperature monitoring module that can be effectively mounted on all such bushings.

In some embodiments, each triggered temperature monitoring modules 100, 100' communicates with the local receiver 182, which may be an onsite monitor system at the substation. The triggered temperature monitoring module 100 may provide the local receiver 182 with an indication that the module 100 has been triggered and with location data or a pre-designated address of the connection 17, 19 on which the module 100 is mounted. In this manner, an attendant can be alerted (e.g., via the HMI 182A) that a suspected hot spot is present and the location of the suspected hot spot. In some embodiments, the local receiver 182 automatically forwards the trigger and location information to the remote terminal 184, which may be a control center of the electrical power utility, for follow up.

In other embodiments, the module 100 may only signal the local receiver 182 (and the local receiver 192 may only signal the remote terminal 184) that the module 100 has been triggered by a potential hot spot without providing data indicating the specific connector 50, 60. In this case, an alerted operator can then identify the alerting module 100 and associated connector by another technique such as scanning for a visual alert (e.g., the light 130 or flag 242) or an audible alert (e.g., the sound transducer 132).

In some embodiments, the module 100 may be operative to communicate its triggered status (and other information) to the local receiver 182 and not include an onboard alerting device (e.g., the light 130, sound transducer 132 or pop up flag 242).

According to further embodiments, the module 100 can further incorporate mechanical indicator mechanism 240 or the module 200 may further include a sound transducer to provide an audible alarm.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. An electrical power distribution system comprising:
an electrical connector;
an electrical conductor secured to the electrical connector to form an electrical connection; and
a temperature monitoring system including a temperature monitoring device, the temperature monitoring device including a temperature sensor coupled to the connector to detect a temperature of the connection;
wherein:
the temperature monitoring device is a temperature monitoring module;
the connector includes a connection pad;
the connection pad includes a set of pad holes defined therein in a prescribed first pattern;
the temperature monitoring module includes a set of module holes defined therein in a second pattern that matches the first pattern;
the temperature monitoring module is mated with the connection pad such that the module holes are aligned with the pad holes; and
the system includes bolts each extending through a respective aligned pair of the pad holes and the module holes to directly secure the temperature monitoring module to the connection pad.

2. The system of claim 1 wherein the temperature monitoring device includes an integral reporting device operative to alert a user that a temperature event has occurred at the connection.

3. The system of claim 2 wherein the reporting device is operative to generate a visual alert in response to detection of a temperature event at the connection by the temperature monitoring device.

4. The system of claim 3 wherein the reporting device includes a light that is illuminated in response to detection of a temperature event at the connection by the temperature monitoring device.

5. The system of claim 3 wherein the reporting device includes a flag that is deployed in response to detection of a temperature event at the connection by the temperature monitoring device.

6. The system of claim 2 wherein the reporting device is operative to generate an audible alert in response to detection of a temperature event at the connection by the temperature monitoring device.

7. The system of claim 1 wherein the temperature monitoring device includes a wireless transmitter and is operative to emit a wireless reporting signal in response to detection of a temperature event at the connection by the temperature monitoring device.

8. The system of claim 1 including a local receiver configured to receive and process the wireless reporting signal.

9. The system of claim 8 including a remote terminal, wherein the local receiver is configured to transmit data to the remote terminal corresponding to the reporting signal.

10. The system of claim 1 further including a conductor connector secured to an end of the conductor, wherein the conductor connector is secured to the connection pad by the bolts extending through the pad holes and the module holes.

11. The system of claim 1 wherein the first pattern is compliant with NEMA Standard CC 1-2009.

12. The system of claim 1 wherein the temperature monitoring module includes:
   a housing defining a cavity;
   an electrical circuit disposed in the cavity and operatively connected to the temperature sensor; and
   potting disposed in the cavity and environmentally sealing the electrically circuit.

13. The system of claim 1 wherein the temperature monitoring module includes an inductive power supply device.

14. The system of claim 1 wherein:
   the temperature monitoring module includes an integral visual reporting device operative to generate a visual alert in response to detection of a temperature event at the connection by the temperature monitoring module; and
   the temperature monitoring system further includes a wildlife protection cover surrounding the temperature monitoring module and the connection, the wildlife protection cover including a window through which a user can observe the visual alert.

15. The system of claim 1 wherein the electrical connector is mounted on an electrical insulator.

16. The system of claim 1 wherein the electrical connector is mounted on a bus bar.

17. A method for monitoring an electrical power distribution system, the method comprising the steps of:
   electrically securing an electrical conductor to an electrical connector to form a connection;
   providing a temperature monitoring system including a temperature monitoring device, the temperature monitoring device including a temperature sensor; and
   coupling the temperature sensor to the connector to detect a temperature of the connection;
   wherein:
      the temperature monitoring device is a temperature monitoring module;
      the connector includes a connection pad;
      the connection pad includes a set of pad holes defined therein in a prescribed first pattern;
      the temperature monitoring module includes a set of module holes defined therein in a second pattern that matches the first pattern; and
      the step of coupling the temperature sensor to the connector includes:
         mating the temperature monitoring module with the connection pad such that the module holes are aligned with the pad holes; and
         inserting each of a plurality of bolts through a respective aligned pair of the pad holes and the module holes to directly secure the temperature monitoring module to the connection pad.

18. A temperature monitoring module for monitoring a temperature of an electrical connection between an electrical connector and an electrical conductor, the temperature monitoring module comprising:
   an integral temperature sensor to detect a temperature of the connection; and
   an integral reporting device operative to generate an alert in response to detection of a temperature event at the connection by the temperature monitoring module;
   wherein the temperature monitoring module is configured to be secured to the connector;
   wherein:
      the temperature monitoring device is a temperature monitoring module;
      the connector includes a connection pad;
      the connection pad includes a set of pad holes defined therein in a prescribed first pattern;
      the temperature monitoring module includes a set of module holes defined therein in a second pattern that matches the first pattern; and
      the temperature monitoring module is configured to be secured to the connector by:
         mating the temperature monitoring module with the connection pad such that the module holes are aligned with the pad holes; and
         inserting each of a plurality of bolts through a respective aligned pair of the pad holes and the module holes to directly secure the temperature monitoring module to the connection pad.

19. An electrical power distribution substation system comprising:
   an electrical power distribution substation including:
      a plurality of electrical insulators and/or busbars;
      a plurality of electrical connectors each mounted on one of the electrical insulators and/or busbars;
      at least one electrical conductor secured to each of the electrical connectors to form an electrical connection at each of the electrical connectors; and
   a temperature monitoring system including:
      a plurality of temperature monitoring modules each including a temperature sensor; and
      a plurality of fasteners;

wherein:
each of the temperature monitoring modules is mounted on a respective one of the connectors and is directly secured to the connector by at least one of the fasteners; and
each of the temperature monitoring modules includes a temperature sensor coupled to the connector on which the temperature sensor module is mounted to detect a temperature of the connection at the connector.

20. The system of claim 19 wherein the fasteners are bolts.

21. The system of claim 19 wherein:
each temperature monitoring module includes a wireless transmitter and is operative to emit a wireless reporting signal in response to detection of a temperature event at the connection by the temperature monitoring module;
the electrical power distribution substation system includes a local receiver configured to receive and process the wireless reporting signal; and
the electrical power distribution substation system further includes a remote terminal, wherein the local receiver is configured to transmit data to the remote terminal corresponding to the reporting signal.

22. The system of claim 19 wherein:
at least one of the temperature monitoring modules includes an integral visual reporting device operative to generate a visual alert in response to detection of a temperature event at the associated connection by the temperature monitoring module; and
the temperature monitoring system further includes a wildlife protection cover surrounding the at least one temperature monitoring module and its associated connection, the wildlife protection cover including a window through which a user can observe the visual alert.

* * * * *